US012640582B2

(12) United States Patent
Walther et al.

(10) Patent No.: US 12,640,582 B2
(45) Date of Patent: May 26, 2026

(54) BALANCING TEMPERATURE OF BATTERY MANAGEMENT SYSTEM CIRCUITS

(71) Applicant: Infineon Technologies AG, Neubiberg (DE)

(72) Inventors: Christian Walther, Munich (DE); Christian Heiling, Graz (AT); Felix Weidner, Munich (DE); Heinrich Trebo, Hitzendorf (AT)

(73) Assignee: Infineon Technologies AG, Neubiberg (DE)

( * ) Notice: Subject to any disclaimer, the term of this patent is extended or adjusted under 35 U.S.C. 154(b) by 799 days.

(21) Appl. No.: 18/061,069

(22) Filed: Dec. 2, 2022

(65) Prior Publication Data

US 2024/0186814 A1     Jun. 6, 2024

(51) Int. Cl.
*H02J 7/90*          (2026.01)
*G01R 31/374*        (2019.01)
          (Continued)

(52) U.S. Cl.
CPC ............ *H02J 7/977* (2026.01); *G01R 31/374* (2019.01); *G01R 31/3835* (2019.01);
          (Continued)

(58) Field of Classification Search
CPC .. H02J 7/007194; H02J 7/0013; H02J 7/0016; H02J 7/0047; G01R 31/374;
          (Continued)

(56) References Cited

U.S. PATENT DOCUMENTS

| | | | | | |
|---|---|---|---|---|---|
| 5,703,468 | A | * | 12/1997 | Petrillo | ..................... H02J 7/35 |
| | | | | | 320/101 |
| 5,990,664 | A | | 11/1999 | Rahman | |

(Continued)

FOREIGN PATENT DOCUMENTS

| | | |
|---|---|---|
| CN | 101971575 A | 2/2011 |
| CN | 103299652 A | 9/2013 |

(Continued)

OTHER PUBLICATIONS

I. C. Guran, L. A. Perioară, A. Florescu and D. I. Săcăleanu, "4-Cell Passive Battery Management System for Automotive Applications," 2021 IEEE 27th International Symposium for Design and Technology in Electronic Packaging (SIITME), Timisoara, Romania, 2021, pp. 338-341 (Year: 2021).*

(Continued)

*Primary Examiner* — M Baye Diao
(74) *Attorney, Agent, or Firm* — Shumaker & Sieffert, P.A.

(57)          ABSTRACT

Circuitry to measure individual battery cells of a battery pack and make corrections to account for environmental differences between battery cells and their associated measuring circuit. Several cell supervision circuits (CSCs) may be placed to monitor and manage one or more subsets of battery cells within the battery pack. The temperature of this battery pack is not distributed homogeneously which may cause a temperature gradient and affect the internal regulation circuit that generates a reference voltage used to determine the voltage of its supervised cell or cells and regulates power to the CSC components. This reference voltage is temperature dependent and thus a temperature mismatch of the CSCs. Based on the measurement circuit an external regulation terminal controls a pass device to share power (Continued)

between the pass device and the internal regulation circuit to manage the temperature of each CSC.

19 Claims, 6 Drawing Sheets

(51) Int. Cl.

| | | |
|---|---|---|
| *G01R 31/3835* | (2019.01) | |
| *H01M 10/42* | (2006.01) | |
| *H01M 10/48* | (2006.01) | |
| *H02J 7/50* | (2026.01) | |

(52) U.S. Cl.
CPC ..... *H01M 10/4257* (2013.01); *H01M 10/482* (2013.01); *H02J 7/50* (2026.01); *H01M 2010/4271* (2013.01); *H01M 2220/20* (2013.01)

(58) Field of Classification Search
CPC .............. G01R 31/3835; G01R 31/396; G01R 31/382; H01M 10/4257; H01M 10/482; H01M 2010/4271; H01M 2220/20; H01M 10/425; H01M 10/48; H01M 10/486; B60L 58/12; B60L 58/18; B60L 58/24; B60L 2240/545; B60L 2240/547
USPC ......................................................... 320/137
See application file for complete search history.

(56) References Cited

U.S. PATENT DOCUMENTS

| | | | |
|---|---|---|---|
| 6,005,869 A | | 12/1999 | Sakai et al. |
| 6,037,750 A | * | 3/2000 | Von Novak ........... H02J 7/0016 |
| | | | 320/132 |
| 6,713,993 B2 | * | 3/2004 | Descombes ............. G05F 1/565 |
| | | | 323/273 |
| 7,579,811 B2 | | 8/2009 | Sato |
| 7,723,960 B2 | | 5/2010 | Funabashi |
| 7,801,028 B2 | | 9/2010 | Jin et al. |
| 7,915,863 B2 | | 3/2011 | Wong |
| 9,728,993 B2 | | 8/2017 | Butzmann |
| 10,050,316 B2 | | 8/2018 | Keser et al. |
| 10,367,239 B1 | * | 7/2019 | Dao .................... H01M 50/209 |
| 10,396,570 B2 | * | 8/2019 | Loncarevic ........... H02J 7/0014 |
| 10,436,852 B2 | | 10/2019 | Ruiz Sevillano et al. |
| 10,505,374 B2 | | 12/2019 | Kain et al. |
| 10,778,006 B2 | * | 9/2020 | Parmar ............... H02J 7/00309 |
| 10,901,045 B2 | * | 1/2021 | Weidner .............. H01M 10/425 |
| 10,950,903 B2 | * | 3/2021 | Wampler, II ........ H01M 10/488 |
| 10,983,165 B2 | * | 4/2021 | Tabatowski-Bush ........................ |
| | | | G01R 31/364 |
| 11,112,463 B2 | * | 9/2021 | Dulle .................. G01R 31/3842 |
| 11,128,158 B2 | * | 9/2021 | Mulawski ............. H02J 7/0047 |
| 11,133,536 B2 | * | 9/2021 | Kim .................. H01M 10/4257 |
| 11,233,406 B2 | | 1/2022 | Kain et al. |
| 11,715,848 B2 | * | 8/2023 | Tabatowski-Bush ........................ |
| | | | H02J 7/0013 |
| | | | 318/139 |
| 11,750,004 B2 | * | 9/2023 | Su ........................ G01R 31/367 |
| | | | 320/118 |
| 11,848,430 B2 | * | 12/2023 | Kain .................... H01M 10/425 |
| 11,881,733 B2 | * | 1/2024 | Rowe .................. H01M 50/543 |
| 12,113,381 B2 | * | 10/2024 | Choi .................... H02J 7/0019 |
| 2004/0008719 A1 | | 1/2004 | Ying |
| 2006/0091854 A1 | * | 5/2006 | Chen .................... H02J 7/0016 |
| | | | 320/116 |
| 2006/0271805 A1 | | 11/2006 | Pearce |
| 2009/0168643 A1 | | 7/2009 | Jin et al. |
| 2010/0033128 A1 | * | 2/2010 | Densham ............. H02J 7/0016 |
| | | | 320/116 |

| | | | |
|---|---|---|---|
| 2010/0085885 A1 | | 4/2010 | Sakurada |
| 2010/0150162 A1 | | 6/2010 | Nakayama |
| 2010/0295382 A1 | | 11/2010 | Tae et al. |
| 2011/0080138 A1 | | 4/2011 | Nakanishi |
| 2012/0133370 A1 | | 5/2012 | Kubo |
| 2014/0152261 A1 | * | 6/2014 | Yamauchi ........... H01M 10/441 |
| | | | 320/118 |
| 2014/0281079 A1 | | 9/2014 | Biskup |
| 2015/0019771 A1 | | 1/2015 | Greef |
| 2015/0104673 A1 | | 4/2015 | de Greef et al. |
| 2015/0115868 A1 | | 4/2015 | Ping |
| 2015/0309121 A1 | | 10/2015 | Butzmann |
| 2016/0018319 A1 | | 1/2016 | Hegyi |
| 2016/0061906 A1 | | 3/2016 | Cho |
| 2016/0169976 A1 | * | 6/2016 | Miura ................... H02J 7/0029 |
| | | | 324/434 |
| 2016/0233709 A1 | | 8/2016 | Lee |
| 2016/0254667 A1 | | 9/2016 | Lee |
| 2016/0275783 A1 | | 9/2016 | Lewonig |

FOREIGN PATENT DOCUMENTS

| | | | | |
|---|---|---|---|---|
| CN | 103308863 A | | 9/2013 | |
| CN | 103888333 A | | 6/2014 | |
| CN | 104483630 A | | 4/2015 | |
| CN | 104579876 A | | 4/2015 | |
| CN | 204597507 U | | 8/2015 | |
| CN | 104953684 A | | 9/2015 | |
| CN | 103568859 B | * | 5/2017 | .......... G01R 31/396 |
| KR | 20080113232 A | * | 12/2008 | ............ H02J 7/0031 |
| KR | 102106344 B1 | * | 5/2020 | ............ H05K 1/189 |
| WO | 2014090529 A1 | | 6/2014 | |

OTHER PUBLICATIONS

"Hybrid Electric, Plug-in Hybrid Electric and Electric Vehicle (HEV/PHEV/EV) Battery Management Solutions," Intersil Automotive Solutions, 2012, 2 pp. (Applicant points out, in accordance with MPEP 609.04(a), that the year of publication, 2012, is sufficiently earlier than the effective U.S. filing date, Aug. 4, 2016, so that the particular month of publication is not in issue.).

"Intersil Cell Balancing System," Intersil Automotive EV/HEV Products, retrieved from http://www.intersil.com/auto/EVHEV_asp on Mar. 8, 2011, 5 pp.

"TLE8000 Lithium-Ion Battery Monitoring and Balancing IC," Infineon Technologies AG, Product Brief, Oct. 2012, 2 pp.

Electromobility—Battery Management for Electric Vehicles, Infineon Technologies Presentation, retrieved from http://www.infineon.com/cms/media/elearning/Automotive/eMobilityBatteryManagement/IG087-eMobilityBatteryManagement-FINALS/IG087-eMobilityBatteryManagementlindex.htm on May 12, 2016, 1 pp.

LTC6804-1/LTC6804-2, Multicell Battery Monitors, Linear Technology, Jun. 2014, 74 pp.

Infineon, "Application Note", Infineon Technologies AG, Apr. 3, 2020, 32 pp., Retrieved from the Internet on Nov. 23, 2022 from URL: https://www.infineon.com/dgdl/Infineon-Cell_Supervision_Circuit_CSC_using_TLE9012AQU_&_TLE9015QU-Application-Notes-v01_30-EN.pdf?fileId=5546d46272e49d2a01730963e147453c.

Ismail et al., "Understanding and overcoming the challenges of building high voltage automotive battery management systems", Infineon Technologies AG, 25 pp., Retrieved from the Internet on Nov. 23, 2022 from URL: https://www.infineon.com/dgdl/Infineon-INF1197_ART_BMS_Whitepaper_d08-Whitepaper-v01_00-EN.pdf?fileId=8ac78c8c7f2a768a017f8da0f4ff7734&da=t.

Reynaert et al., "RF-through-Plastics," KU Leuven, Nov. 17, 2015, 30 pp.

Tytgat et al., "A plastic waveguide receiver in 40nm CMOS with on-chip bondwire antenna," Proceedings of the ESSCIRC, IEEE, Sep. 16-20, 2013, 4 pp.

* cited by examiner

RECEIVE, BY A CONTROL CIRCUIT FOR A MEASUREMENT CIRCUIT, AN INDICATION FROM A TEMPERATURE SENSOR OF THE TEMPERATURE OF THE MEASUREMENT CIRCUIT — 90

COMPARE THE RECEIVED INDICATION FROM THE TEMPERATURE SENSOR TO A TEMPERATURE SETPOINT — 92

CHANGE A POWER SHARING SETPOINT FOR THE MEASUREMENT CIRCUIT BASED ON COMPARISON, — 94

BALANCING TEMPERATURE OF BATTERY MANAGEMENT SYSTEM CIRCUITS

TECHNICAL FIELD

The disclosure relates battery pack management circuitry.

BACKGROUND

A battery management system (BMS) is a system that monitors and regulates the charging and discharging of a battery in some examples by enabling some functionalities such as monitor the pack and cells parameters (including voltages, currents, temperature), calculate and estimate the battery & cell states (states of charge, health, power, and safety), optimize the battery performance/operation (including balance cells, request for cooling/heating battery pack) and may protect the battery from being operated outside the safe operating regions (for example, during events like over current, over/under charge) The individual BMS sub-functions may be specific to a particular battery pack application and therefore differ considerably depending on the system design. Some example applications may include battery packs used in hybrid electric vehicles (HEV), plug-in hybrid electric vehicles (PHEV), battery electric vehicles (BEV) as well as in stationary Lithium-Ion batteries. Vehicles may include larger vehicles like a commuter bus, as well as automobiles, industrial vehicles such as a forklift and similar applications. In the example of Li-ion batteries, utilizing a battery pack to its maximum may be desirable because Li-ion chemistry is a complex chemistry that may benefit from proper management. Incorrect management of the cells can reduce the efficiency, lifetime and performance of the battery.

SUMMARY

In general, the disclosure describes circuitry used to measure individual battery cells of a battery pack and make corrections to account for environmental differences between individual battery cells and their associated measuring circuit. In some examples, the measuring circuits of this disclosure may be part of a battery management system (BMS) and may be adapted to monitor and adjust operation of one or more cell supervision circuits (CSCs). Within a battery pack several CSCs may be placed to monitor and manage one or more subsets of battery cells within a battery pack. In some examples, a "subset" may be just one battery cell. The temperature of this battery pack is not distributed homogeneously which causes a temperature gradient. Every CSC may be equipped with a local reference circuitry which generates a reference voltage which is used to determine the voltage of its supervised cell or cells. This reference voltage is temperature dependent and thus a temperature mismatch of the CSCs may lead to inaccurate cell voltage readings compared to other CSCs.

In one example, this disclosure describes a measurement circuit comprising a plurality of connection terminals configured to connect between respective battery cells of a plurality of battery cells of a battery pack, wherein the plurality of battery cells are connected in series, an internal regulation circuit configured to regulate power provided to the measurement circuit, and an external regulation terminal configured to connect to a control terminal of a pass device, wherein the pass device is configured to regulate voltage to the measurement circuit.

In another example, this disclosure describes a system comprising a battery pack including a plurality of battery cells, wherein the plurality of battery cells are connected in series, a pass device, a measurement circuit comprising a plurality of connection terminals configured to connect between respective battery cells of the plurality of battery cells of the battery pack, an internal regulation circuit configured to regulate power provided to the measurement circuit, an external regulation terminal configured to connect to a control terminal of the pass device, wherein the pass device is configured to regulate a supply voltage to the measurement circuit, and a power sharing control loop, the power sharing control loop comprising the external regulation terminal, a temperature sensor configured to measure a temperature of the measurement circuit, a control circuit configured to: receive an indication from the temperature sensor of the temperature of the measurement circuit, and adjust the supply voltage to the measurement circuit by adjusting operation of the pass device via the external regulation terminal to change a power sharing setpoint for the measurement circuit.

In another example, this disclosure describes a method comprising receiving, by a control circuit for a measurement circuit, an indication from a temperature sensor of the temperature of the measurement circuit, wherein the measurement circuit comprises: a plurality of connection terminals configured to connect between respective battery cells of the plurality of battery cells of a battery pack, wherein the plurality of battery cells are connected in series, an internal regulation circuit configured to regulate power provided to the measurement circuit, an external regulation terminal configured to connect to a control terminal of a pass device, wherein the pass device is configured to regulate a supply voltage to the measurement circuit, comparing the received indication from the temperature sensor to a temperature setpoint, changing a power sharing setpoint for the measurement circuit based on comparison, by outputting a command via the external regulation terminal to the pass device adjust the supply voltage to the measurement circuit by adjusting operation of the pass device via the external regulation terminal to change.

The details of one or more examples are set forth in the accompanying drawings and the description below. Other features, objects, and advantages will be apparent from the description, drawings, and claims.

DETAILED DESCRIPTION

The disclosure describes circuitry to manage individual battery cells of a battery pack and make corrections to account for environmental differences between the battery cells and associated measuring circuit. The measurement circuitry of this disclosure may regulate the junction temperature of the measurement device by shifting power losses between the measurement circuit and an external pass device. The power losses, also called power consumption, is based on power used to operate the CSCs. The junction temperature can be increased or minimized with shifting power without increasing the overall power consumption of the CSC. The pass device of this disclosure may include any of a MOS transistor, bipolar transistor, switch mode converter, DC/DC pre-regulator and similar circuitry. The circuitry of this disclosure may compensate for a gradient in ambient temperature within the battery stack to avoid different junction temperatures of the various measurement devices and hence the temperature measurement results, and voltage control, may be more comparable.

Figure 1:
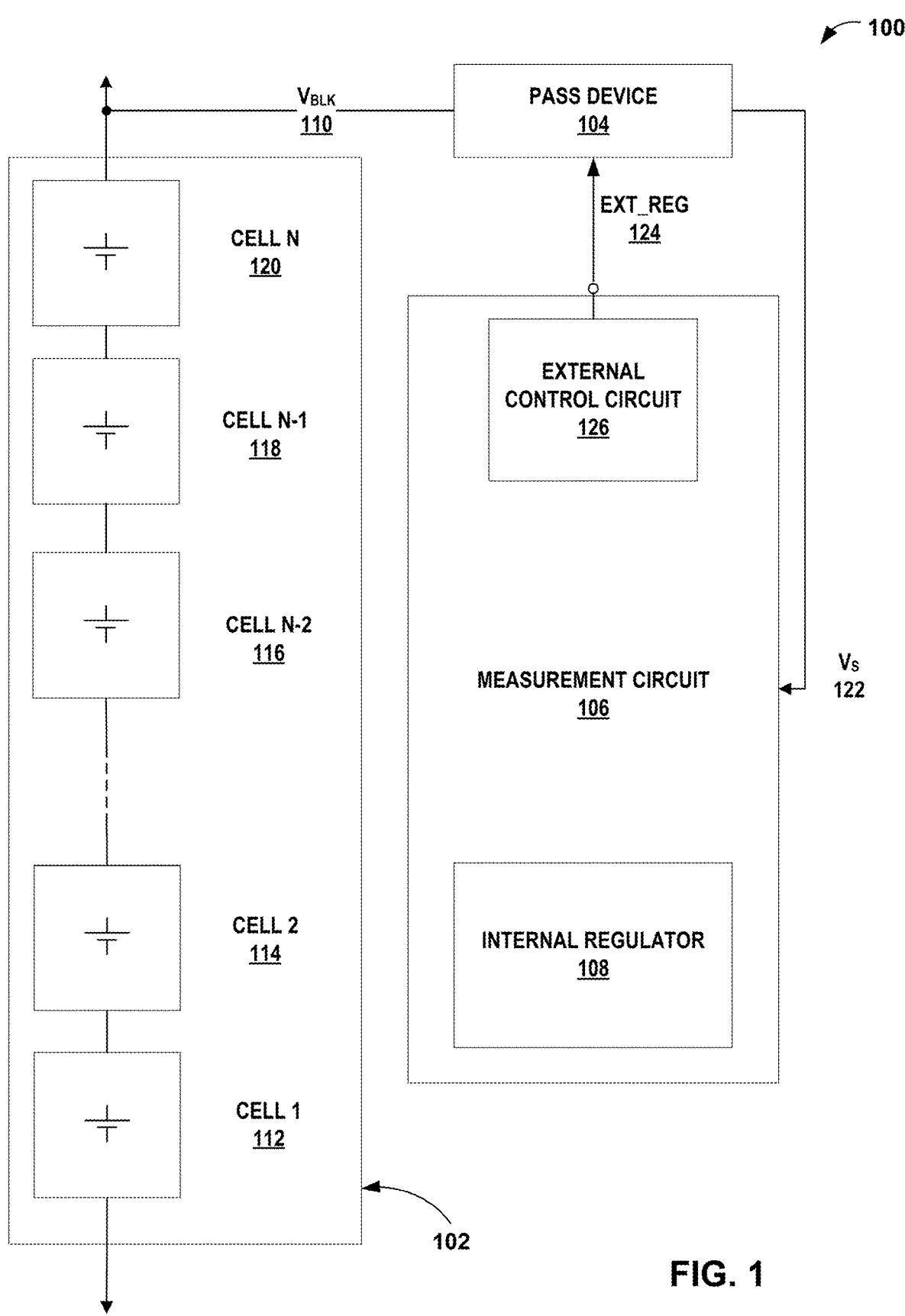
FIG. 1 is a block diagram illustrating an example measurement circuit arrangement for a battery pack, according to one or more techniques of this disclosure.

FIG. 1 is a block diagram illustrating an example measurement circuit arrangement for a battery pack, according to one or more techniques of this disclosure. System 100, in the example of FIG. 1, includes battery pack 102, also called a battery stack in this disclosure, which includes a plurality of battery cells. In the example of FIG. 1, battery pack 102 includes cell 1 112, cell 2 114, through cell N 120 connected in series. Measurement circuit 106 may be included in a CSC (not shown in FIG. 1) configured to monitor and manage one or more subsets of battery cells within battery pack 102. Although FIG. 1 shows only one measurement circuit 106, multiple CSCs may manage subsets of battery cells, including a subset of one battery cell. Therefore, although only one measurement circuit 106 is shown for simplicity, battery pack may have several measurement cells, with each measurement cell associated with a subset of battery cells.

Measurement circuit 106 may include several connection terminals (not shown in FIG. 1) that connect between respective battery cells of the plurality of battery cells of battery pack 102, for example to the respective subset of battery cells managed by the CSC associated with measurement circuit 106.

Measurement circuit 106 also includes an internal regulation circuit, e.g., internal regulator 108, which is configured to regulate power provided to the measurement circuit. For example, internal regulator 108 may include circuitry to supply power to various components of measurement circuit 106, as well as to components of the CSC in some examples. Internal regulator 108 may include one or more reference power supplies, digital circuitry supplies, analog circuitry supplies and similar circuits. In some examples, internal regulator 108 may include a low drop out (LDO) power supply, or other linear regulator, as well as other power supply circuitry.

Measurement circuit 106 includes an external regulation terminal EXT_REG 124 configured to connect to a control terminal of pass device 104. Pass device 104 is configured to regulate voltage Vs 122 to the measurement circuit. As noted above, pass device 104 may be implemented as any one or more of a power transistor, a DC-DC converter, a configurable linear regulator, e.g., a configurable LDO, a metal oxide semiconductor field effect transistor (MOS- FET), junction field effect transistor (JFET), an insulated gate bipolar junction transistor (IGBT), a bipolar junction transistor (BJT) or any similar device configured to regulate power. External control circuit 126 may adjust the voltage to measurement circuit 106 by adjusting operation of pass device 104 via EXT_REG 124 to change a power sharing setpoint for measurement circuit 106. In some examples, external control circuit 126 and pass device 104 may operate as a linear regulator.

Changing the power sharing setpoint may regulate the junction temperature of measurement device 106 by shifting power losses between the measurement IC and an external pass device. The power losses may also be described power consumption caused by operating the CSCs. As described above, system 100 may include several CSCs to monitor respective subsets of battery cells. However, the temperature of a battery pack, such as battery pack 102 may not distributed homogeneously along the stacked battery cells, which may cause a temperature gradient. In some examples, every CSC may be equipped with local reference circuitry, e.g., internal regulator 108, which generates a reference voltage used to determine the voltage of its supervised cells. This reference voltage is temperature dependent and thus a temperature mismatch of between the various CSCs may lead to inaccurate cell voltage readings compared to other peers CSCs.

By adjusting the power sharing setpoint, the junction temperature can be increased or decreased without increasing the overall power losses. In this manner, the circuitry of system 100 may manage an inevitable gradient in ambient temperature within the battery stack, such as to avoid different junction temperatures of measurement circuits, such as measurement circuit 106, and hence the temperature measurement results may be more comparable between measurement circuits associated with each CSC.

Figure 2:
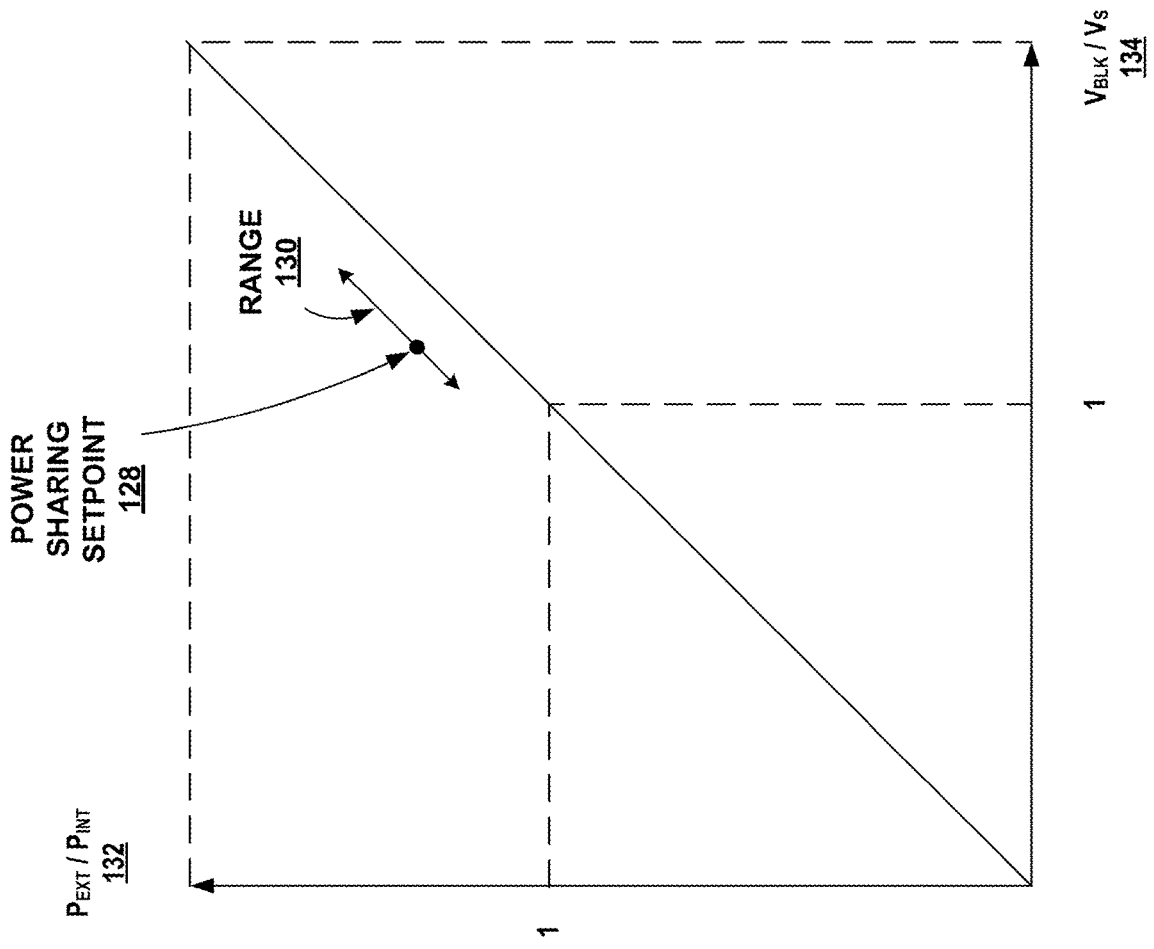
FIG. 2 is a graph illustrating a power sharing setpoint for controlling the temperature of a measurement circuit of this disclosure.

FIG. 2 is a graph illustrating a power sharing setpoint for controlling the temperature of a measurement circuit of this disclosure. External control circuit 126 of FIG. 1 may set power sharing setpoint 128 along range 130. The Y-axis of the graph in the example of FIG. 2 is the ratio between the power dissipated by the pass device 104 (Pext) and power dissipated, or consumed, by internal regulator 108 (Pint) as internal regulator 108 supplies power to the components of measurement circuit 106, and other components of the associated CSC. The X-axis of is the ratio of the voltage measured at the respective subset of supervised battery cells Vblk 110 of FIG. 1 and the voltage supplied to measurement circuit 106, Vs 122, based on the setting of pass device 104, as described above in relation to FIG. 1. In other words, the total power losses being the sum of the internal power losses, PINT, and the external power losses, PEXT, can be shifted between the external pass device and measurement circuit 106 by varying the voltage fed to the measurement circuit, Vs 122. In some examples, the sum of power loss may be constant.

In this manner, the power sharing setpoint is based on the ratio of a voltage of the battery pack Vblk to the voltage to the measurement circuit Vs. In some examples, a control circuit (not shown in FIG. 2) may be configured to increase a temperature of a battery management circuit, e.g., a CSC associated with a subset of battery cells, by increasing the voltage to the measurement circuit thereby decreasing the power sharing setpoint. Similarly, the control circuit may decrease the temperature of the battery management circuit by decreasing the voltage to the measurement circuit thereby increasing the power sharing setpoint. The total power loss (power consumption) of the circuit is the sum of power provided by the internal regulator circuit, e.g., internal regulator 108 and power used by the pass device, e.g., pass device 104.

Figure 3:
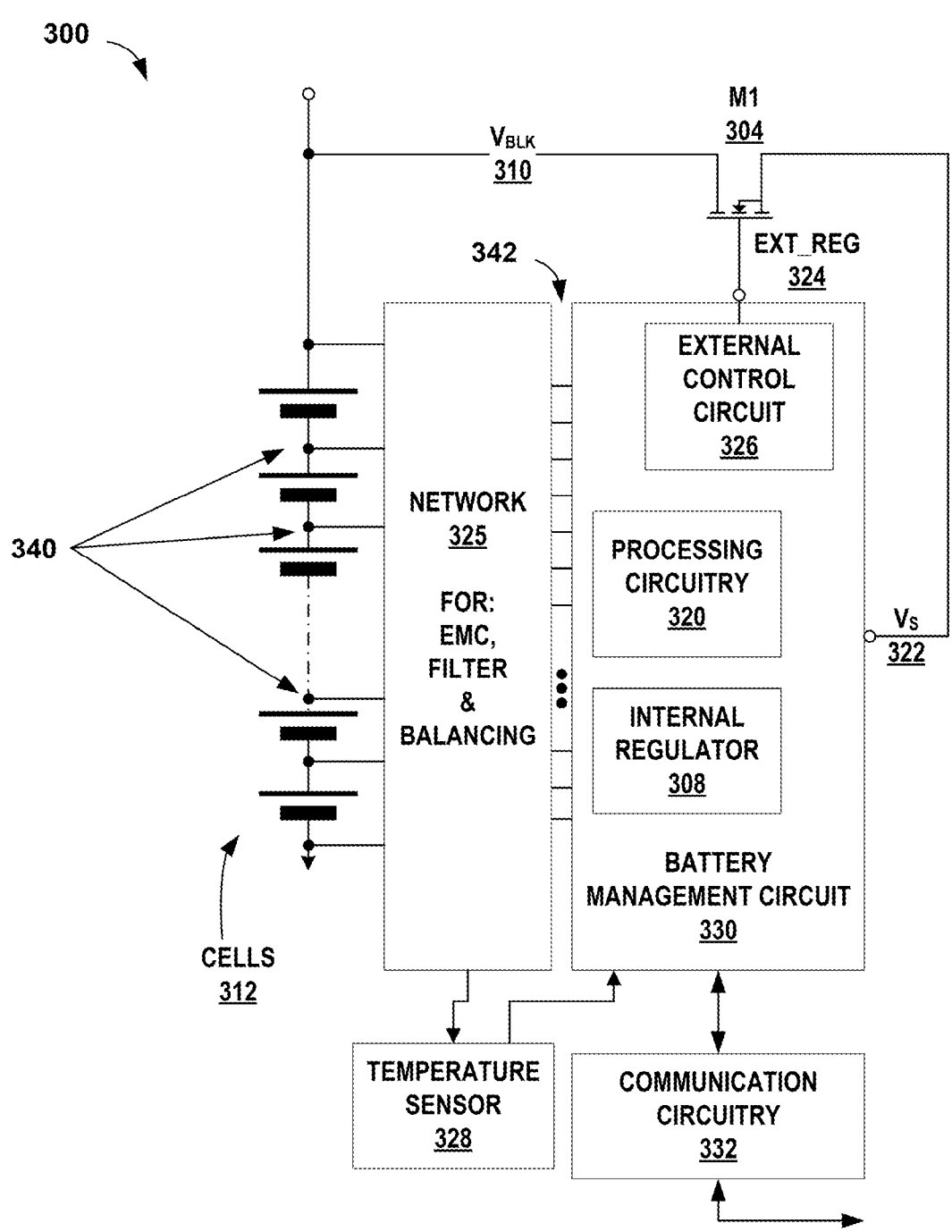
FIG. 3 is a block and schematic diagram illustrating one possible example implementation of a cell supervision circuit that includes the measurement circuit and power sharing control loop of this disclosure.

FIG. 3 is a block and schematic diagram illustrating one possible example implementation of a cell supervision circuit that includes the measurement circuit and power sharing control loop of this disclosure. In the example of FIG. 3, system 300 is an example of a battery management system similar to system 100 described above in relation to FIGS. 1 and 2 with the same or similar functions and characteristics. In other examples, systems 100 and 300 may have more or fewer components and may be arranged or grouped in a different manner than shown in the examples of FIGS. 1 and 3.

System 300 includes a battery stack of cells 312 connected in series. The battery stack may supply power to any number of loads, including a vehicle motor and support systems, a building back-up power supply, and similar applications. Battery management circuit 330 may also be referred to as a cell supervision circuit, as described above in relation to FIG. 1.

In some examples, the cell supervision circuit may comprise both battery management circuit 330 as well as network 325. Network 325, in some examples, may include various components, either integrated or discrete components, such as capacitors, resistors, inductors, switches, and similar components configured to balance, filter or otherwise condition electronic signals. Network 325 may also include circuitry for electromagnetic compatibility (EMC) protection.

Battery management circuit 330, may be configured to manage the operation, e.g., balance the charging and discharging, of a subset of cells 312. Although only a single battery management circuit is shown in FIG. 1 to simplify the description, system 300 may include several battery management circuits for different subsets of cells 312. Battery management circuit 330 may include circuitry that performs the measurement functions of measurement circuit 106 described above in relation to FIG. 1.

Battery management circuit 300 also includes an internal regulation circuit, e.g., internal regulator 308 configured to regulate power provided to the measurement circuit as well as external control circuit 326 connected to pass device M1 304. External control circuit 326 connects to the control terminal, e.g., the gate of MOSFET M1 304 via external regulation terminal, EXT_REG 324. M1 304 connects between Vblk 310 and Vs 322 and regulates the voltage, Vs 322 to battery management circuit 330, based on the power sharing setpoint described above in relation to FIGS. 1 and 2. As described above in relation to FIG. 1, in some examples, external control circuit 326 and pass device 304 may operate as a linear regulator. Battery management circuit 330, as well as network 325 include connection terminals 340 and 342 configured to connect between respective battery cells 312. In some examples, portions of system 300 may be implemented as an integrated circuit (IC) and connect to cells 312 via terminals 342 and 340.

In some examples, the measurement circuitry of system 300 may be a component or sub-circuit of a power sharing control loop configured to regulate the junction temperature of the measurement circuitry by shifting power losses between pass device M1 304 and internal regulator 308. In some examples, the power sharing control loop may include the external regulation terminal, EXT_REG 324, a connection to temperature sensor 328, which is configured to measure a temperature of the measurement circuitry and a control circuit. The control circuit may receive an indication from temperature sensor 328, e.g., and electronic signal, that includes the temperature of the measurement circuitry. The control circuit of the power sharing control loop may adjust the voltage Vs 322 to the measurement circuitry of battery management circuit 330 by adjusting operation of pass device M1 304 via the EXT_REG 324. Adjusting the operation of pass device M1 304 may change a power sharing setpoint for the measurement circuitry, as described above in relation to FIG. 2.

In some examples, the control circuit for the power sharing control loop, e.g., the temperature controller, may be integrated with the measurement circuitry. In the example of FIG. 3, processing circuitry 320 may perform the functions of the control circuit of the power sharing control loop and adjust the operation of pass device M1 304 based on the power sharing setpoint. In other examples, the temperature control function may be executed based on software for a main processor (not shown in FIG. 3) for a system that includes system 300. An example of a main processor may include a body control unit (BCU) for an electric vehicle. In other examples, the temperature controller may be a separate, stand-alone device (not shown in FIG. 3).

Examples of a control circuit, such as processing circuitry 320, may include any one or more of a microcontroller (MCU), e.g. a computer on a single integrated circuit containing a processor core, memory, and programmable input/output peripherals, a microprocessor (µP), e.g. a central processing unit (CPU) on a single integrated circuit (IC), a controller, a digital signal processor (DSP), an application specific integrated circuit (ASIC), a field-programmable gate array (FPGA), a system on chip (SoC) or equivalent discrete or integrated logic circuitry. A processor may be integrated circuitry, i.e., integrated processing circuitry, and that the integrated processing circuitry may be realized as fixed hardware processing circuitry, programmable processing circuitry and/or a combination of both fixed and programmable processing circuitry.

In some examples, processing circuitry may be operatively connected to a memory device (not shown in FIG. 3). Examples of a memory device may include any type of computer-readable storage media, such as random access memory (RAM), read only memory (ROM), programmable read only memory (PROM), erasable programmable read only memory (EPROM), one-time programmable (OTP) memory, electronically erasable programmable read only memory (EEPROM), flash memory, or another type of volatile or non-volatile memory device. In some examples the computer readable storage media may store instructions that cause the processing circuitry to execute the functions described herein. In some examples, the computer readable storage media may store data, such as configuration information, temporary values and other types of data used to perform the functions of this disclosure.

Figure 4:
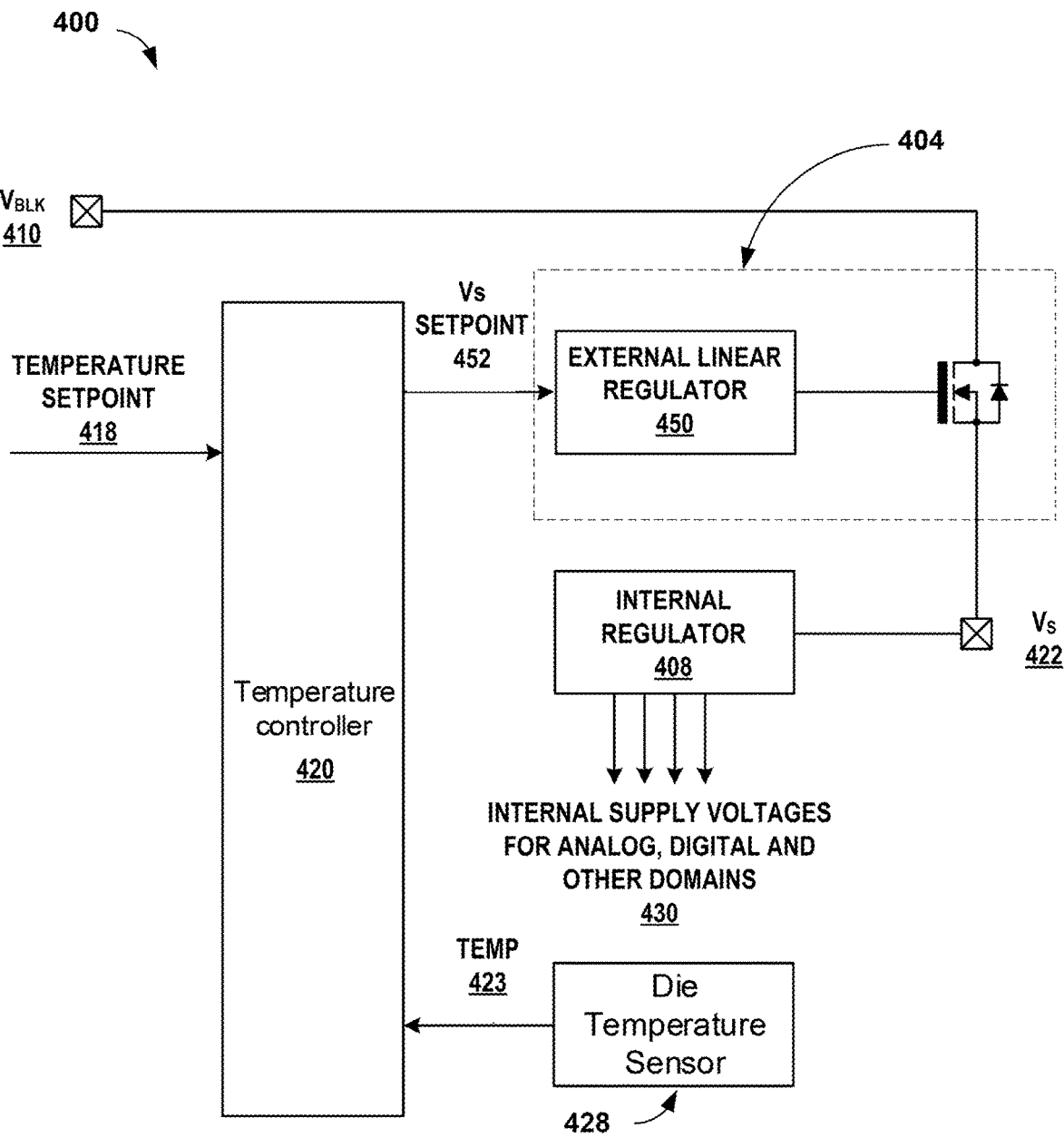
FIG. 4 is a is a block and schematic diagram illustrating one possible example implementation of the power sharing control loop of this disclosure.

FIG. 4 is a is a block and schematic diagram illustrating another possible example implementation of the power sharing control loop of this disclosure. System 400 in the example of FIG. 4 illustrates another variation of the battery management system of this disclosure. Any of the components shown in FIGS. 1, and 3-5 may be combined, separated or regrouped to perform the functions described in this disclosure. In the example of FIG. 4, Vblk 410 connects to the subset of battery cells to be monitored (not shown in FIG. 4) and to pass device 404. Temperature controller 420 connects to a control terminal of pass device 404 via external regulation terminal, Vs setpoint 452. Pass device 404 is configured to regulate voltage Vs 422 connected to internal regulator 408. In the example of FIG. 4, pass device 404 is implemented as a stand-alone device, which includes configurable linear regulator 450 and a switch. In some examples, such a pass device may not receive direct control signals to adjust the switch, but instead receive a setpoint, e.g., Vs setpoint 452, and the linear regulator 450 may directly manage the operation of the switch. As described above in relation to FIGS. 1 and 3, internal regulator 408 may provide regulated internal supply voltages for analog, digital and other circuitry domains 430. In some examples, internal regulator 408 may be implemented as an LDO, as described above.

In some examples, to implement the temperature regulation scheme, system 400 may use an internal temperature sensor 428 of the die that includes the measurement circuitry. As described above in relation to FIG. 3, portions of the cell supervision circuit that includes the measurement circuit may be implemented on an IC, including one or more integrated circuit die on an IC package. Because of the internal temperature effects, each voltage measurement device, e.g., a CSC, may be equipped with an internal die temperature sensor 428. Similar to the example of FIG. 3, system 400 may include multiple CSCs with each controlling a subset of battery cells. FIG. 4 illustrates only one such circuit.

The temperature regulation function of the power sharing control loop may additionally use temperature information provided by temperature sensor 428 in order to regulate for a constant junction temperature on the die for an accurate reference voltage. Temperature controller 420 may be implemented on the CSC device itself or by a central microcontroller or other processing circuitry. For example, if implemented on the CSC device, or a separate device located near the CSC, temperature controller 420 may receive a desired temperature setpoint 418 from the higher-level system controller (not shown in FIG. 4). Subsequently the voltage setpoint for external linear regulator 450 controller may be adjusted accordingly to balance the power dissipation between external pass device 404 and internal regulator 408 in a way that the desired temperature setpoint can be achieved.

The example circuits of this disclosure deliver advantages over other types of battery management circuits. A system including the circuitry of this disclosure may balance the temperature of all measurement ICs across many subsets of battery cells to match each other. Balancing the temperature in this manner may increase the overall accuracy with minimal effort on a system level. The circuitry of this disclosure may be desirable in a variety of battery charging/discharging management applications, including systems configured to achieve the stringent requirements for relative voltage measurement accuracy to manage some types of battery cells, such as lithium iron phosphate battery (LiFcPO 4 battery) or LFP battery (lithium ferrophosphate).

Figures 5A, 5B:
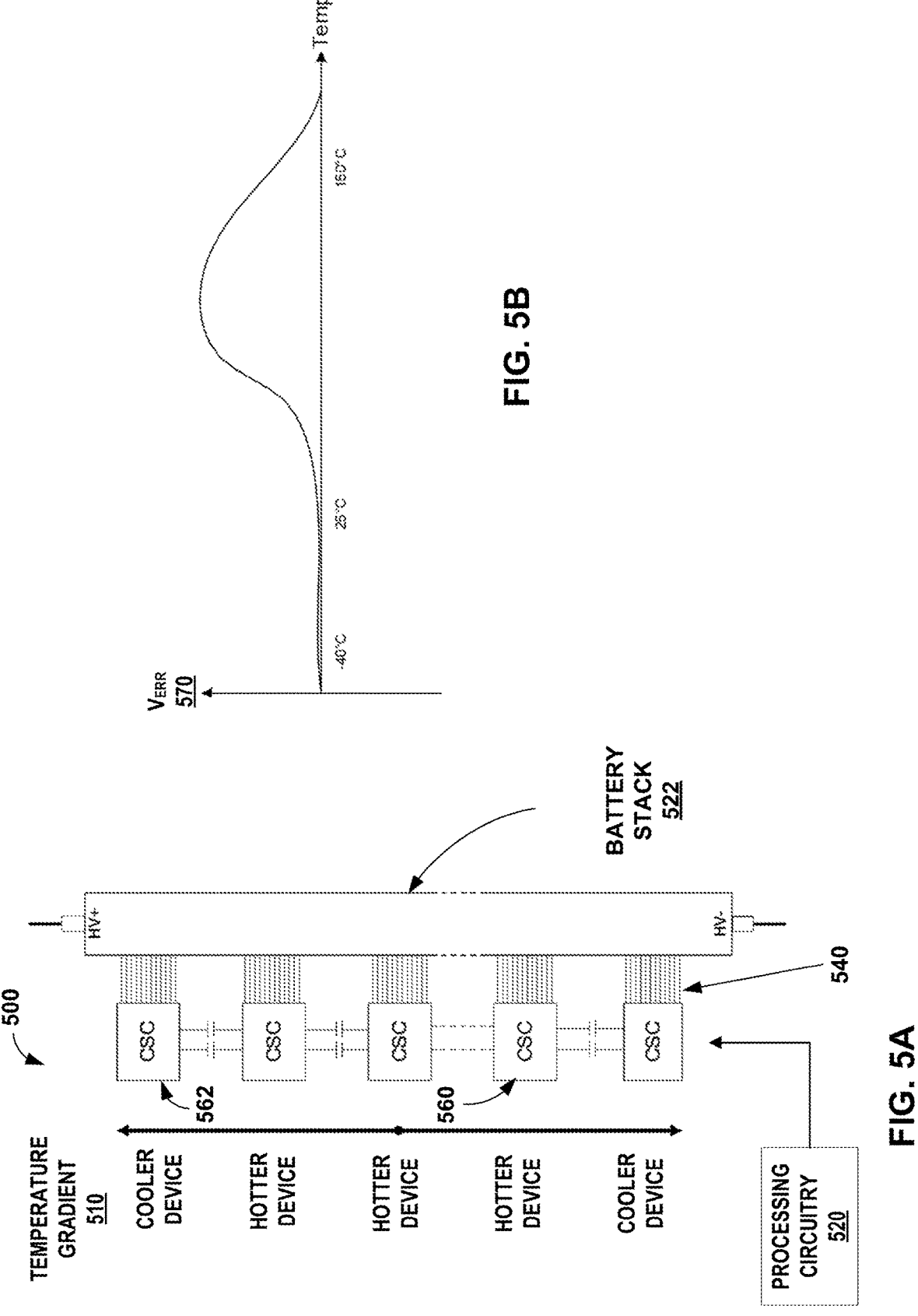
FIG. 5A is a block diagram illustrating an example system that with cell supervision circuits that include one or more measurement circuits of this disclosure.
FIG. 5B is a graph showing the impact on the voltage measurement error caused by a temperature gradient.

FIG. 5A is a block diagram illustrating an example system that with cell supervision circuits that include one or more measurement circuits of this disclosure. System 500 in the example of FIG. 5A is an example of systems 100, 300 and 400 described above in relation to FIGS. 1-4. System 500 includes battery stack 522 with a number of battery cells connected in series and may be grouped into subsets of battery cells. System 500 also illustrates several CSCs, where each CSC may be configured to manage the operation of a subset of battery cells. Though not specifically shown in FIG. 5A, each CSC may include a measurement circuit and multiple connection terminals 540 configured to connect between respective battery cells. Each CSC may also include an internal regulation circuit configured to regulate power provided to the measurement circuit, and other components of the CSC. As described above in relation to FIG. 3, each CSCs may include a network of components, which may be external to a CSC implemented as an IC that include circuitry for filtering, EMC, and other functions (not shown in FIG. 5A).

Each CSC may connect to a control terminal of a pass device via an external regulation terminal (not shown in FIG. 5A). A pass device may be implemented as any of the varieties described above, such as a transistor, stand-alone regulator circuit, e.g., an LDO, a DC-DC converter or similar voltage control device.

Each CSC may implement a power sharing control loop as described above in relation to FIGS. 1-4. In some examples each CSC may include an internal temperature sensor configured to measure a temperature of the measurement circuit. In other examples, the CSC may connect to an external temperature sensor. The control circuit for the power sharing control loop may be located internal to the CSC, as shown in FIG. 4. In other examples, the control circuit may be implemented by external processing circuitry, such as processing circuitry 520. The control circuit may receive an indication from the temperature sensor for the measurement circuit and adjust the supply voltage to the measurement circuit by adjusting operation of the pass device to change the power sharing setpoint.

FIG. 5B is a graph showing the impact on the voltage measurement error caused by a temperature gradient. The error voltage, Verr 570, may vary based on the changes in temperature along the battery stack, e.g., battery stack 522 depicted in FIG. 5A.

To compensate, as described above in relation to FIGS. 1-5A, system 500 may include a pass device associated with a first CSC 562 and at least a second pass device associated with a second CSC 560. Because of the location on battery stack 522, the temperature of CSC 562 may be different from the temperature of CSC 560. Changes in temperature may cause a voltage error, e.g., Verr 570, that may affect a first reference voltage output by the internal regulator of CSC 562 and a second reference voltage associated with CSC 562.

In the example of a central control circuit for system 500, e.g., implemented by processing circuitry 520, the control circuit may receive an indication from the second temperature sensor of the temperature of CSC 562. The control circuit may adjust a respective supply voltage to the measurement circuit for CSC 560 and the second measurement circuit for CSC 562 to maintain temperatures for the first measurement circuit and the second measurement circuit to approximately the same temperature.

In other examples, the control circuit is a first control circuit integrated with the first measurement circuit, e.g., associated with CSC 560. System 500 may also include a second control circuit integrated with the second measurement circuit, e.g., associated with CSC 562. In this arrangement, the first control circuit (for CSC 560) and the second control circuit (for CSC 562) may each receive a respective temperature setpoint, such as from a central controller, or preconfigured when installed with battery stack 522. Each respective CSC may adjust the respective supply voltage to the respective first measurement circuit and second measurement by adjusting operation of the respective first pass device and second pass device to maintain the temperature of the respective measurement circuit based on the received respective temperature setpoint. In some examples, the received temperature setpoint may be two different values.

In other examples, the received temperature setpoint may be equal or approximately equal.

Figure 6:
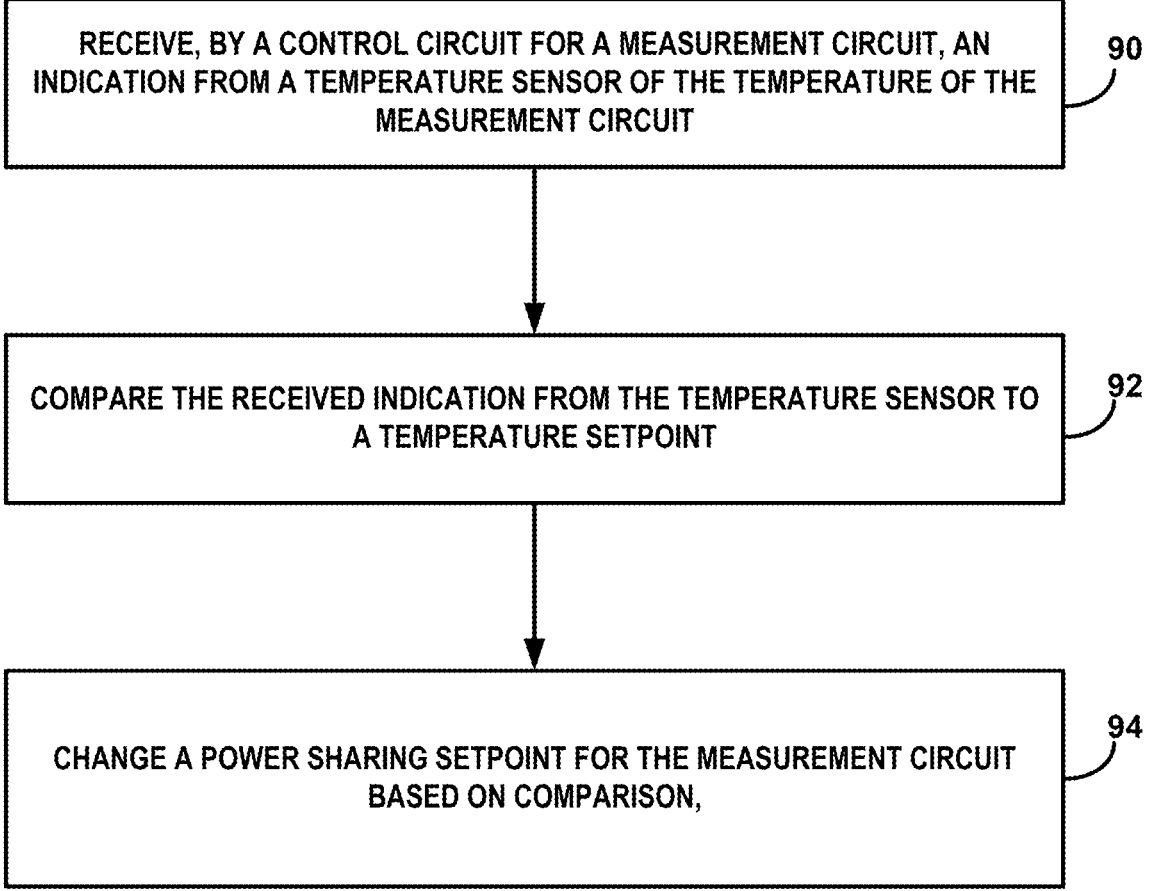
FIG. 6 is a flow chart illustrating an example operation of the system of this disclosure.

FIG. 6 is a flow chart illustrating an example operation of the system of this disclosure. The blocks of FIG. 6 will be described in terms of system 300 of FIG. 3, unless otherwise noted. The steps of FIG. 6 may equally apply to any of the examples, combinations, or variations of systems 100, 300, 400 or 500 described in this disclosure.

A control circuit for a measurement circuit, e.g., processing circuitry 320, or some external processor, may receive an indication from temperature sensor 328 for the measurement circuit of battery management circuit 330 (90). Temperature sensor 328 may be integrated with the measurement circuit, or an external temperature sensor, as described above in relation to FIG. 3.

The control circuit may compare the received indication from the temperature sensor to a temperature setpoint (92) and change a power sharing setpoint for the measurement circuit based on comparison (94), as described above in relation to FIG. 2. Adjusting the power sharing setpoint may control the junction temperature, and therefore the accuracy of the reference voltage generated by internal regulation circuit 308.

The techniques of this disclosure may also be described in the following clauses.

Clause 1: A measurement circuit comprising a plurality of connection terminals configured to connect between respective battery cells of a plurality of battery cells of a battery pack, wherein the plurality of battery cells are connected in series; an internal regulation circuit configured to regulate power provided to the measurement circuit; and an external regulation terminal configured to connect to a control terminal of a pass device, wherein the pass device is configured to regulate voltage to the measurement circuit.

Clause 2: The circuit of clause 1, wherein the measurement circuit is a component of a power sharing control loop, the power sharing control loop comprising the external regulation terminal; a connection to a temperature sensor configured to measure a temperature of the measurement circuit; a control circuit configured to: receive an indication from the temperature sensor of the temperature of the measurement circuit; adjust the voltage to the measurement circuit by adjusting operation of the pass device via the external regulation terminal to change a power sharing setpoint for the measurement circuit.

Clause 3: The circuit of clause 2, wherein the measurement circuit is a sub-circuit of a battery management circuit, the battery management circuit comprising a controller configured to control the operation of the plurality of battery cells, wherein the operation comprises charging and discharging the plurality of battery cells.

Clause 4: The circuit of clause 3, wherein the controller performs the function of the control circuit in the power sharing control loop.

Clause 5: The circuit of any of clauses 2 through 4, wherein the power sharing setpoint is based on the ratio of: a voltage of the battery pack; to the voltage to the measurement circuit, wherein the control circuit is configured to: increase a temperature of the battery management circuit by increasing the voltage to the measurement circuit thereby decreasing the power sharing setpoint; and decrease the temperature of the battery management circuit by decreasing the voltage to the measurement circuit thereby increasing the power sharing setpoint.

Clause 6: The circuit of clause 5, wherein a total power loss of the measurement circuit is the sum of power provided by an internal regulator circuit of the measurement circuit and power used by the pass device.

Clause 7: The circuit of any of clauses 2 through 6, wherein the temperature sensor is integrated with the measurement circuit.

Clause 8: The circuit of any of clauses 1 through 7, wherein the pass device comprises any one of: a power transistor, a DC-DC converter, a metal oxide semiconductor field effect transistor (MOSFET), an insulated gate bipolar junction transistor (IGBT), JFET, or a bipolar junction transistor (BJT).

Clause 9: A system comprising a battery pack comprising a plurality of connection terminals configured to connect between respective battery cells of the plurality of battery cells of the battery pack; an internal regulation circuit configured to regulate power provided to the measurement circuit; an external regulation terminal configured to connect to a control terminal of the pass device, wherein the pass device is configured to regulate a supply voltage to the measurement circuit; a power sharing control loop, the power sharing control loop comprising the external regulation terminal; a temperature sensor configured to measure a temperature of the measurement circuit; a control circuit configured to: receive an indication from the temperature sensor of the temperature of the measurement circuit; adjust the supply voltage to the measurement circuit by adjusting operation of the pass device via the external regulation terminal to change a power sharing setpoint for the measurement circuit.

Clause 10: The system of clause 9, further comprising control the operation of the plurality of battery cells via the plurality of connection terminals, wherein the operation comprises charging and discharging the plurality of battery cells.

Clause 11: The system of clause 10, wherein the controller performs the function of the control circuit in the power sharing control loop.

Clause 12: The system of any of clauses 9 through 11, wherein the power sharing setpoint is based on the ratio of: a voltage of the battery pack; to the voltage to the measurement circuit, wherein the control circuit is configured to: increase a temperature of the battery management circuit by increasing the voltage to the measurement circuit thereby decreasing the power sharing setpoint; and decrease a temperature of the battery management circuit by decreasing the voltage to the measurement circuit thereby increasing the power sharing setpoint.

Clause 13: The system of any of clauses 9 through 12, wherein the measurement circuit is a first measurement circuit configured to connect to a first subset of respective battery cells of the battery pack, the system further comprising configured to connect to a second subset of respective battery cells of the battery pack; and comprising the same structure, function and characteristics as the first measurement circuit.

Clause 14: The system of clause 13, wherein the pass device is a first pass device, the system further comprising a second pass device is configured to regulate the supply voltage to the second measurement circuit; wherein the temperature sensor is a first temperature sensor, the system further comprising a second temperature sensor configured to measure a temperature of the second measurement circuit.

Clause 15: The system of clause 14, wherein the control circuit is configured to: receive an indication from the second temperature sensor of the temperature of the second measurement circuit; adjust a respective supply voltage to the first measurement circuit and the second measurement circuit to maintain temperatures for the first measurement circuit and the second measurement circuit to approximately the same temperature.

Clause 16: The system of clause 14, wherein the control circuit is a first control circuit integrated with the first measurement circuit, the system further comprising receive a respective temperature setpoint; adjust a respective supply voltage to the respective first measurement circuit and second measurement by adjusting operation of the respective first pass device and second pass device to maintain the temperature of the respective measurement circuit based on the received respective temperature setpoint.

Clause 17: The system of any of clauses 9 through 16, wherein the pass device comprises any one of: a power transistor, a DC-DC converter, a configurable LDO, a metal oxide semiconductor field effect transistor (MOSFET), junction field effect transistor (JFET), an insulated gate bipolar junction transistor (IGBT), or a bipolar junction transistor (BJT).

Clause 18: The system of clause 17, where an output from the external regulation terminal is configurable to control operation of any type of pass device to adjust the supply voltage to the measurement circuit.

Clause 19: A method comprising receiving, by a control circuit for a measurement circuit, an indication from a temperature sensor of the temperature of the measurement circuit, wherein the measurement circuit comprises: a plurality of connection terminals configured to connect between respective battery cells of the plurality of battery cells of a battery pack, wherein the plurality of battery cells are connected in series; an internal regulation circuit configured to regulate power provided to the measurement circuit; an external regulation terminal configured to connect to a control terminal of a pass device, wherein the pass device is configured to regulate a supply voltage to the measurement circuit; comparing the received indication from the temperature sensor to a temperature setpoint, changing a power sharing setpoint for the measurement circuit based on comparison, by outputting a command via the external regulation terminal to the pass device adjust the supply voltage to the measurement circuit by adjusting operation of the pass device via the external regulation terminal to change.

Clause 20: The method of clause 19, wherein the power sharing setpoint is based on the ratio of: a voltage of the battery pack; to the voltage to the measurement circuit, wherein the control circuit is configured to: increase a temperature of the battery management circuit by increasing the voltage to the measurement circuit thereby decreasing the power sharing setpoint; and decrease a temperature of the battery management circuit by decreasing the voltage to the measurement circuit thereby increasing the power sharing setpoint.

Various examples of the disclosure have been described. These and other examples are within the scope of the following claims.

What is claimed is:

1. A measurement circuit, the circuit comprising:
a plurality of connection terminals configured to connect between respective battery cells of a plurality of battery cells of a battery pack, wherein the plurality of battery cells is connected in series;
an internal regulation circuit configured to regulate power provided to the measurement circuit; and
an external regulation terminal configured to connect to a control terminal of a pass device, wherein the pass device is configured to regulate voltage to the measurement circuit, wherein the measurement circuit is a component of a power sharing control loop, the power sharing control loop comprising:
the external regulation terminal;
a connection to a temperature sensor configured to measure a temperature of the measurement circuit; and
a control circuit configured to:
receive an indication from the temperature sensor; and
adjust the voltage to the measurement circuit by adjusting operation of the pass device via the external regulation terminal to change a power sharing setpoint for the measurement circuit.

2. The circuit of claim 1, wherein the measurement circuit is a sub-circuit of a battery management circuit, the battery management circuit comprising a controller configured to control the operation of the plurality of battery cells, wherein the operation comprises charging and discharging the plurality of battery cells.

3. The circuit of claim 2, wherein the controller functions as the control circuit in the power sharing control loop.

4. The circuit of claim 1,
wherein the power sharing setpoint is based on a ratio of:
a voltage of the battery pack; to
the voltage to the measurement circuit,
wherein the control circuit is configured to:
increase a temperature of a battery management circuit by increasing the voltage to the measurement circuit thereby decreasing the power sharing setpoint; and
decrease the temperature of the battery management circuit by decreasing the voltage to the measurement circuit thereby increasing the power sharing setpoint.

5. The circuit of claim 4, wherein a total power loss of the measurement circuit is a sum of power provided by the internal regulator circuit of the measurement circuit and power used by the pass device.

6. The circuit of claim 1, wherein the temperature sensor is integrated with the measurement circuit.

7. The circuit of claim 1, wherein the pass device comprises any one of: a power transistor, a DC-DC converter, a metal oxide semiconductor field effect transistor (MOSFET), an insulated gate bipolar junction transistor (IGBT), JFET, or a bipolar junction transistor (BJT).

8. A system comprising:
a battery pack comprising a plurality of battery cells, wherein the plurality of battery cells are connected in series;
a pass device;
a measurement circuit comprising:
a plurality of connection terminals configured to connect between respective battery cells of the plurality of battery cells of the battery pack;
an internal regulation circuit configured to regulate power provided to the measurement circuit;
an external regulation terminal configured to connect to a control terminal of the pass device, wherein the pass device is configured to regulate a supply voltage to the measurement circuit; and
a power sharing control loop, the power sharing control loop comprising:
the external regulation terminal;
a temperature sensor configured to measure a temperature of the measurement circuit; and
a control circuit configured to:
receive an indication from the temperature sensor; and
adjust the supply voltage to the measurement circuit by adjusting operation of the pass device via the external regulation terminal to change a power sharing setpoint for the measurement circuit.

9. The system of claim 8, further comprising a controller configured to control the operation of the plurality of battery cells via the plurality of connection terminals, wherein the operation comprises charging and discharging the plurality of battery cells.

10. The system of claim 9, wherein the controller functions as the control circuit in the power sharing control loop.

11. The system of claim 8, wherein the power sharing setpoint is based on a ratio of:

a voltage of the battery pack to the supply voltage to the measurement circuit, wherein the control circuit is configured to:

increase a temperature of the measurement circuit by increasing the supply voltage to the measurement circuit thereby decreasing the power sharing setpoint; and decrease a temperature of the measurement circuit by decreasing the voltage to the measurement circuit thereby increasing the power sharing setpoint.

12. The system of claim 8, wherein the measurement circuit is a first measurement circuit configured to connect to a first subset of respective battery cells of the battery pack, the system further comprising a second measurement circuit:

configured to connect to a second subset of respective battery cells of the battery pack; and comprising a same structure, function and characteristics as the first measurement circuit.

13. The system of claim 12, wherein the pass device is a first pass device, the system further comprising a second pass device is configured to regulate the supply voltage to the second measurement circuit; and wherein the temperature sensor is a first temperature sensor, the system further comprising a second temperature sensor configured to measure a temperature of the second measurement circuit.

14. The system of claim 13, wherein the control circuit is configured to:

receive an indication from the second temperature sensor for the second measurement circuit; and adjust a respective supply voltage to the first measurement circuit and the second measurement circuit to maintain temperatures for the first measurement circuit and the second measurement circuit to approximately a same temperature.

15. The system of claim 12, wherein the control circuit is a first control circuit integrated with the first measurement circuit, the system further comprising a second control circuit integrated with the second measurement circuit, and wherein the first control circuit and the second control circuit are each configured to:

receive a respective temperature setpoint; and adjust a respective supply voltage to a respective first measurement circuit and a second measurement circuit by adjusting operation of the first pass device and a second pass device to maintain a temperature of the first measurement circuit and the second measurement circuit based on a received respective temperature setpoint.

16. The system of claim 8, wherein the pass device comprises any one of: a power transistor, a DC-DC converter, a configurable LDO, a metal oxide semiconductor field effect transistor (MOSFET), junction field effect transistor (JFET), an insulated gate bipolar junction transistor (IGBT), or a bipolar junction transistor (BJT).

17. The system of claim 16, where an output from the external regulation terminal is configurable to control operation of any type of pass device to adjust the supply voltage to the measurement circuit.

18. A method comprising:

receiving, by a control circuit for a measurement circuit, an indication from a temperature sensor associated with the measurement circuit, wherein the measurement circuit comprises:

a plurality of connection terminals configured to connect between respective battery cells of a plurality of battery cells of a battery pack, wherein the plurality of battery cells are connected in series;

an internal regulation circuit configured to regulate power provided to the measurement circuit; and an external regulation terminal configured to connect to a control terminal of a pass device, wherein the pass device is configured to regulate a supply voltage to the measurement circuit;

comparing the received indication from the temperature sensor to a temperature setpoint, and changing a power sharing setpoint for the measurement circuit based on comparison, by outputting a command via the external regulation terminal to the pass device adjust the supply voltage to the measurement circuit by adjusting operation of the pass device via the external regulation terminal to change.

19. The method of claim 18, wherein the power sharing setpoint is based on a ratio of:

a voltage of the battery pack to the supply voltage to the measurement circuit, wherein the control circuit is configured to:

increase a temperature of a battery management circuit by increasing the supply voltage to the measurement circuit thereby decreasing the power sharing setpoint; and decrease a temperature of the battery management circuit by decreasing the voltage to the measurement circuit thereby increasing the power sharing setpoint.

* * * * *